(12) United States Patent
Ikeda et al.

(10) Patent No.: US 12,278,294 B2
(45) Date of Patent: Apr. 15, 2025

(54) PHOTO DETECTING DEVICE

(71) Applicant: Japan Display Inc., Tokyo (JP)

(72) Inventors: Masanobu Ikeda, Minato-ku (JP);
Yasuhiro Kanaya, Minato-ku (JP)

(73) Assignee: Japan Display Inc., Tokyo (JP)

(\*) Notice: Subject to any disclaimer, the term of this patent is extended or adjusted under 35 U.S.C. 154(b) by 453 days.

(21) Appl. No.: 17/650,718

(22) Filed: Feb. 11, 2022

(65) Prior Publication Data

US 2022/0165891 A1 May 26, 2022

Related U.S. Application Data

(63) Continuation of application No. PCT/JP2020/026068, filed on Jul. 2, 2020.

(30) Foreign Application Priority Data

Aug. 27, 2019 (JP) ................ 2019-154816

(51) Int. Cl.
| H01L 31/0224 | (2006.01) |
| H01L 31/02 | (2006.01) |
| H01L 31/0216 | (2014.01) |
| H01L 33/32 | (2010.01) |

(52) U.S. Cl.
CPC .. *H01L 31/02161* (2013.01); *H01L 31/02024* (2013.01); *H01L 31/0224* (2013.01); *H01L 33/32* (2013.01)

(58) Field of Classification Search
CPC ............... H01L 31/021; H01L 31/0024; H01L 31/0224; H01L 33/32; H01L 31/105; H01L 31/173; H01L 25/167

USPC .......................................................... 257/431
See application file for complete search history.

(56) References Cited

U.S. PATENT DOCUMENTS

| 9,136,296 | B2 | 9/2015 | Tanaka |
| 2007/0120496 | A1 | 5/2007 | Shimizu et al. |
| 2009/0184233 | A1* | 7/2009 | Nomura ............... H01L 25/167 |
| | | | 29/592.1 |
| 2010/0155578 | A1* | 6/2010 | Matsumoto ............ H10K 59/65 |
| | | | 250/216 |
| 2010/0301755 | A1 | 12/2010 | Pance et al. |

(Continued)

FOREIGN PATENT DOCUMENTS

| JP | 2006-278368 A | 10/2006 |
| JP | 2010-153449 A | 7/2010 |
| JP | 2011-9117 A | 1/2011 |

(Continued)

OTHER PUBLICATIONS

International Search Report issued Oct. 6, 2020 in PCT/JP2020/026068, filed on Jul. 2, 2020, 3 pages.

*Primary Examiner* — Jami Valentine Miller
*Assistant Examiner* — Ashley Nicole Blackwell
(74) *Attorney, Agent, or Firm* — Maier & Maier, PLLC

(57) ABSTRACT

A photo detecting device comprising: a substrate; a plurality of photoelectric conversion elements provided to the substrate and configured to output a detection signal corresponding to light with which the photoelectric conversion elements are irradiated; at least one or more light emitting elements provided to the substrate; and a control circuit configured to set a wavelength of light output from the light emitting element by controlling an electric current flowing through the light emitting element.

5 Claims, 11 Drawing Sheets

(56) References Cited

U.S. PATENT DOCUMENTS

2016/0329434 A1* 11/2016 Ito ..................... H01L 29/78693
2018/0240843 A1*  8/2018 Mainguet .......... H01L 27/14678

FOREIGN PATENT DOCUMENTS

JP         2011-14752 A      1/2011
WO    WO 2005/011006 A1   2/2005

* cited by examiner

PHOTO DETECTING DEVICE

CROSS-REFERENCE TO RELATED APPLICATION

This application is a continuation of International Patent Application No. PCT/JP2020/026068 filed on Jul. 2, 2020 which designates the United States, incorporated herein by reference, and which claims the benefit of priority from Japanese Patent Application No. 2019-154816 filed on Aug. 27, 2019, incorporated herein by reference.

BACKGROUND

1. Technical Field

The present disclosure relates to a photo detecting device.

2. Description of the Related Art

Japanese Patent Application Laid-open Publication No. 2011-14752 (JP-A-2011-14752) describes a detection device (photoelectric conversion device in JP-A-2011-14752) in which a plurality of photoelectric conversion elements, such as photodiodes, are arrayed on a substrate. Such optical detection devices are used as biometric sensors, such as fingerprint sensors and vein sensors, that detect biometric information.

Such optical sensors may be difficult to downsize if light sources that irradiate an object to be detected with light and sensors that detect light from the object to be detected are mounted on different substrates. To improve the detection performance, such optical sensors preferably include a plurality of light sources having different emission wavelengths. Providing a number of light sources, however, may make it difficult to downsize the optical sensors.

SUMMARY

A photo detecting device according to an embodiment of the present disclosure includes a substrate, a plurality of photoelectric conversion elements provided to the substrate and configured to output a detection signal corresponding to light with which the photoelectric conversion elements are irradiated, at least one or more light emitting elements provided to the substrate, and a control circuit configured to set a wavelength of light output from the light emitting element by controlling an electric current flowing through the light emitting element.

DETAILED DESCRIPTION

Figure 1:
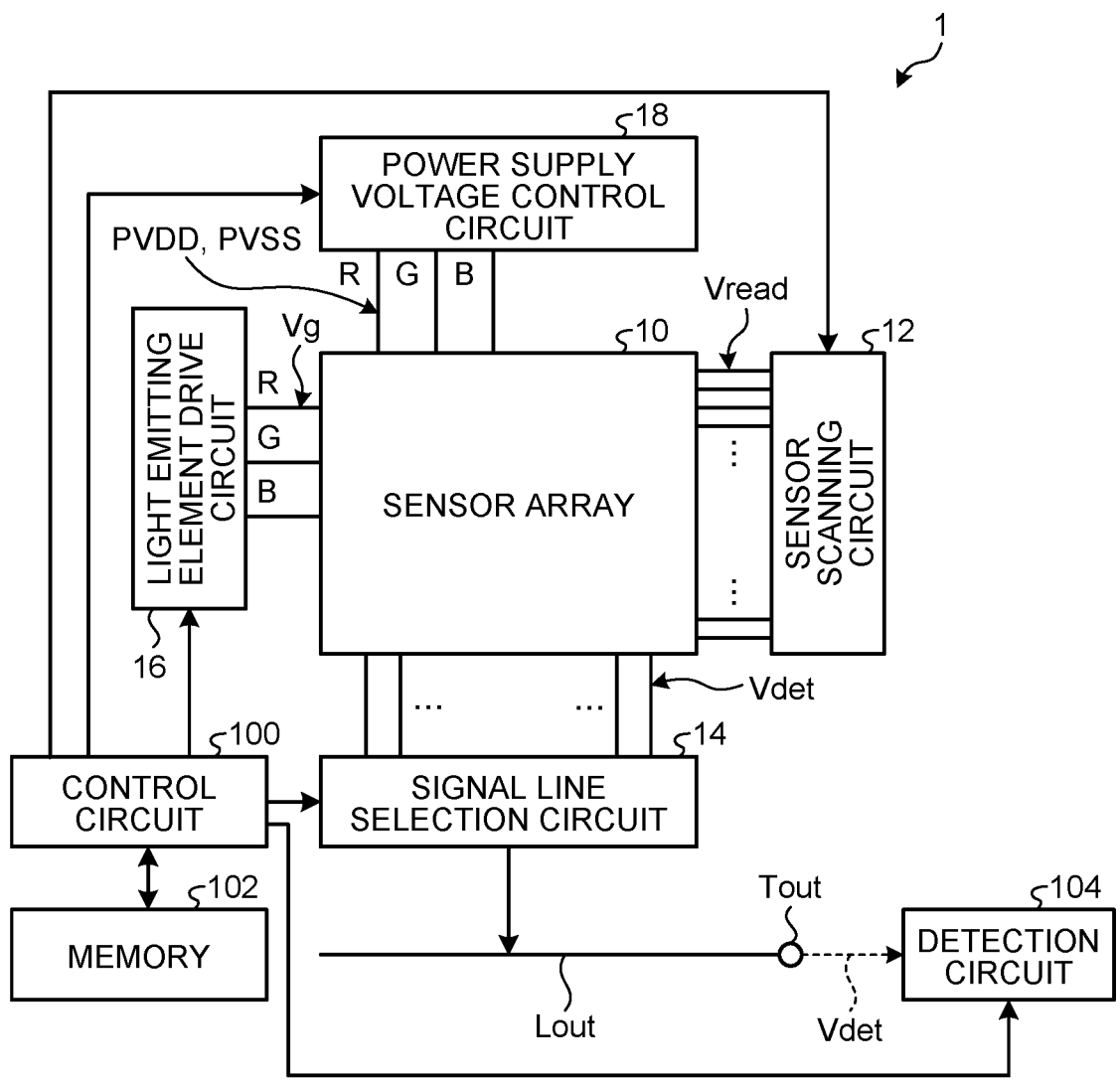
FIG. 1 is a block diagram of an exemplary configuration of a detection device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may illustrate the width, the thickness, the shape, and other elements of each unit more schematically than an actual aspect. These elements, however, are given by way of example only and are not intended to limit interpretation of the present disclosure. In the present specification and the drawings, components similar to those previously described with reference to previous drawings are denoted by like reference numerals, and detailed explanation thereof may be appropriately omitted.

First Embodiment

FIG. 1 is a block diagram of an exemplary configuration of a detection device according to a first embodiment. As illustrated in FIG. 1, a detection device 1 (photo detecting device) includes a sensor array 10, a sensor scanning circuit 12, a signal line selection circuit 14, a light emitting element drive circuit 16, a power supply voltage control circuit 18, a control circuit 100, a memory 102, and a detection circuit 104.

The sensor array 10 is an optical sensor including a plurality of photoelectric conversion elements 3 provided to an array substrate 2 and light emitting elements 5 serving as a light source. The photoelectric conversion elements 3 included in the sensor array 10 are positive intrinsic negative diodes (PIN-type photodiodes) containing silicon, for example. The photoelectric conversion elements 3 output signals corresponding to light with which they are irradiated to the signal line selection circuit 14 as detection signals Vdet. The sensor array 10 performs detection based on scanning signal Vread supplied from the sensor scanning circuit 12.

The control circuit 100 is a circuit that supplies control signals to the sensor scanning circuit 12, the signal line selection circuit 14, the light emitting element drive circuit 16, the power supply voltage control circuit 18, and the detection circuit 104 and that controls their operations. The control circuit 100 is an arithmetic device, that is, a central processing unit (CPU) mounted on the detection device 1. The control circuit 100 performs various kinds of processing by reading computer programs from the memory 102, for example.

The memory 102 is a storage circuit that stores therein information on the contents of arithmetic operations and the computer programs of the control circuit 100. The memory 102 also stores therein in advance information on the photoelectric conversion elements 3 included in the sensor array 10 and information on the light emitting elements 5. The memory 102 may be a random access memory (RAM) or a register circuit, for example.

The sensor scanning circuit 12 is a circuit that selects scanning lines GL (refer to FIG. 4) based on the control signals supplied from the control circuit 100. The sensor scanning circuit 12 sequentially or simultaneously selects a plurality of scanning lines GL and supplies the scanning signals Vread to the selected scanning lines GL. As a result, the sensor scanning circuit 12 selects a plurality of photoelectric conversion elements 3 coupled to the scanning lines GL.

Figure 4:
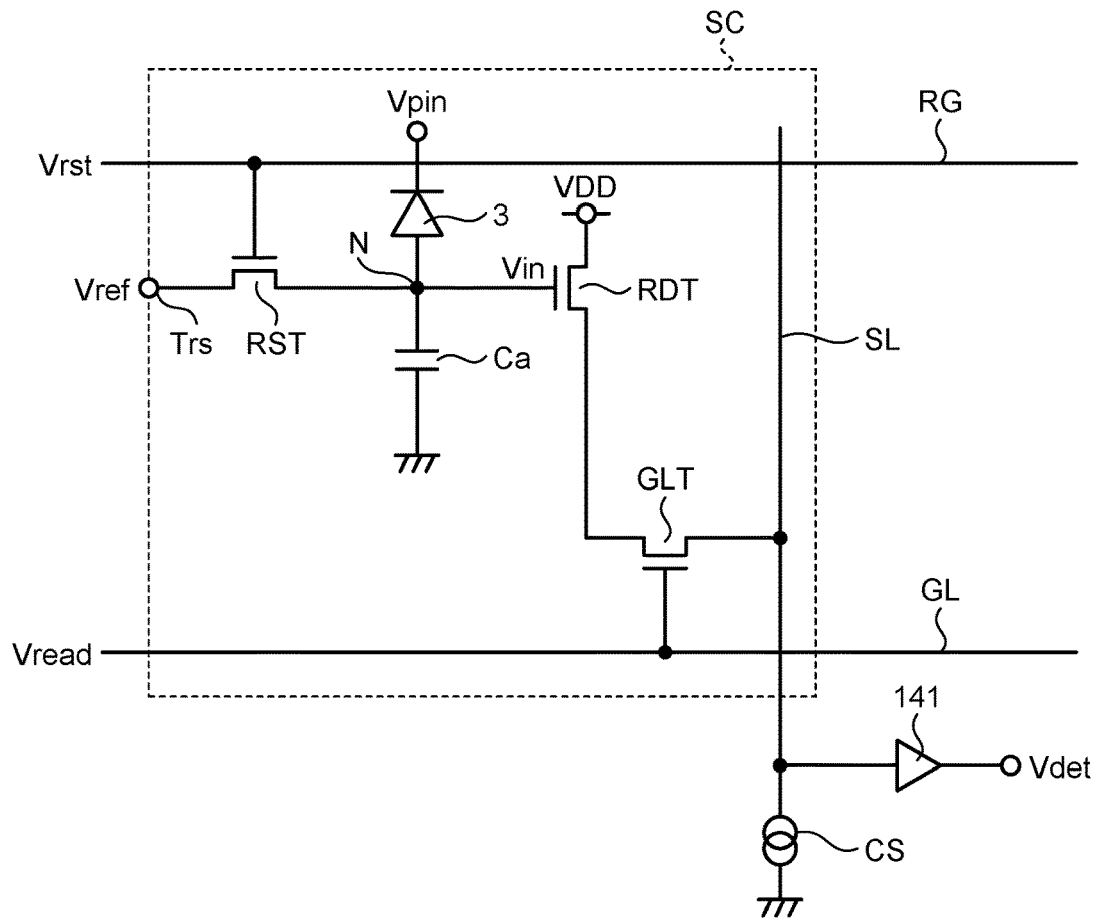
FIG. 4 is a circuit diagram of a unit detection region of a sensor array according to the first embodiment.

The signal line selection circuit 14 is a switching circuit that sequentially or simultaneously selects a plurality of signal lines SL (refer to FIG. 4). The signal line selection circuit 14 couples the selected signal lines SL to the detection circuit 104 based on selection signals supplied from the control circuit 100. As a result, the signal line selection circuit 14 outputs detection signals Vdet of the photoelectric conversion elements 3 corresponding to the selected signal lines SL to the detection circuit 104 via an output signal line Lout. The signal line selection circuit 14 is a multiplexer, for example.

The detection circuit 104 is coupled to the signal line selection circuit 14 via an output terminal Tout and the output signal line Lout. The detection circuit 104 is a signal processing circuit that performs signal processing on the detection signals Vdet and is an analog front end (AFE), for example. The detection circuit 104 has at least functions of a signal amplification circuit and an A/D conversion circuit. The signal amplification circuit amplifies the detection signals Vdet output from the sensor array 10 via the signal line selection circuit 14. The A/D conversion circuit converts analog signals output from the signal amplification circuit into digital signals. While FIG. 1 illustrates one detection circuit 104 to simplify the explanation, a plurality of detection circuits 104 may be provided depending on the number of output terminals of the signal line selection circuit 14 and the resolution of the sensor array 10.

The light emitting element drive circuit 16 is a circuit that drives the light emitting elements 5 based on the control signals supplied from the control circuit 100. Specifically, the light emitting element drive circuit 16 supplies gate drive signals Vg to the gate of a drive transistor DRT provided corresponding to the light emitting element 5. As a result, the drive transistor DRT is turned on, and the selected light emitting element 5 is coupled to the power supply voltage control circuit 18. The light emitting element drive circuit 16 can change a pulse width Wvg of the gate drive signals Vg based on the control signals supplied from the control circuit 100.

The power supply voltage control circuit 18 supplies an anode power supply potential PVDD to an anode terminal 52 of the selected light emitting element 5 and supplies a cathode power supply potential PVSS to a cathode terminal 53 of the light emitting element 5 based on the control signals supplied from the control circuit 100. As a result, an electric current flows through the light emitting element 5 due to the anode power supply potential PVDD and the cathode power supply potential PVSS supplied from the power supply voltage control circuit 18. The light emitting element 5 emits light due to the flowing electric current.

The control circuit 100 sets the wavelength of light output from the light emitting element 5 by controlling the electric current flowing through the light emitting element 5. Specifically, the power supply voltage control circuit 18 includes an amplification circuit, for example, and supplies the anode power supply potential PVDD having a plurality of different electric potentials. The power supply voltage control circuit 18 supplies a fixed reference potential as the cathode power supply potential PVSS. The power supply voltage control circuit 18 sets the anode power supply potential PVDD having different electric potentials for the respective light emitting elements 5, thereby changing the electric current flowing through the light emitting elements 5 and setting the wavelength of light output from the light emitting elements 5. The power supply voltage control circuit 18 may supply a predetermined fixed potential as the anode power supply potential PVDD and supply the cathode power supply potential PVSS having a plurality of different electric potentials. Alternatively, the power supply voltage control circuit 18 may supply a plurality of different electric potentials as both the anode power supply potential PVDD and the cathode power supply potential PVSS. The power supply voltage control circuit 18 may set the anode power supply potential PVDD having different electric potentials for the respective light emitting elements 5 or for respective light emitting element groups arrayed in each row or each column.

In the detection device 1, the light emitting elements 5 output light, and the photoelectric conversion elements 3 detect light reflected by an object to be detected, such as a finger and a palm, in the light output from the light emitting elements 5. As a result, the detection device 1 can detect biometric information on the object to be detected. Examples of the biometric information include, but are not limited to, fingerprints, vascular images (vein patterns) of fingers and palms, pulse waves, pulse rate, blood oxygen level, etc.

Figure 2:
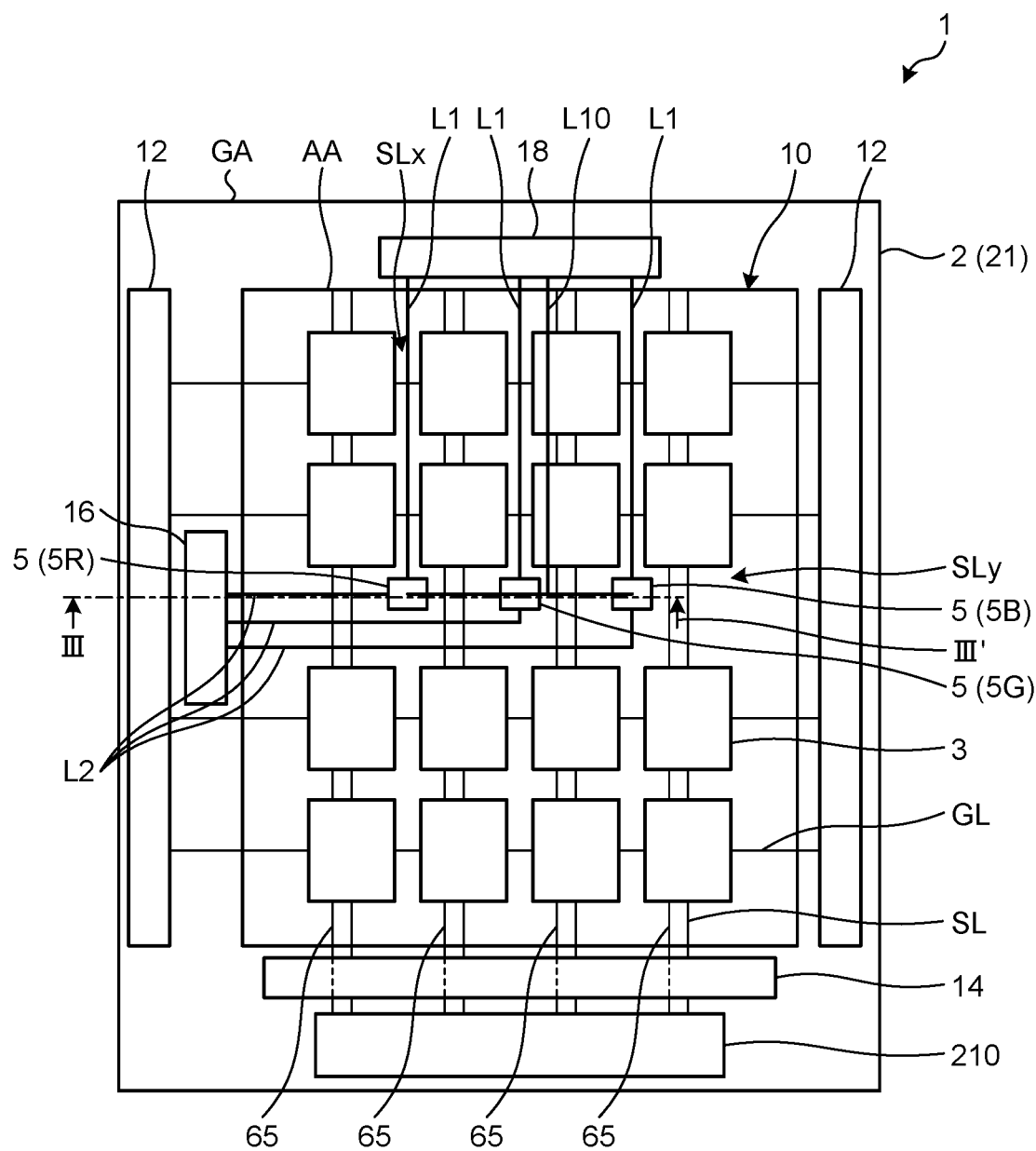
FIG. 2 is a plan view schematically illustrating the detection device according to the first embodiment.

FIG. 2 is a plan view schematically illustrating the detection device according to the first embodiment. As illustrated in FIG. 2, the detection device 1 further includes an array substrate 2 and a drive integrated circuit (IC) 210. The array substrate 2 is a drive circuit board that drives the photoelectric conversion elements 3 and the light emitting elements 5 and is also called a backplane or an active matrix substrate. The array substrate 2 includes a substrate 21, a plurality of transistors, a plurality of capacitances, various kinds of wiring, and other components.

The detection device 1 has a display region AA and a peripheral region GA. The detection region AA is a region provided with the photoelectric conversion elements 3 and the light emitting elements 5 and is a region for detecting the object to be detected in contact with or in proximity to the detection region AA. The peripheral region GA is a region not provided with the photoelectric conversion elements 3 or the light emitting elements 5 and is a region between the outer periphery of the detection region AA and the ends of the substrate 21.

The photoelectric conversion elements 3 are disposed in a matrix (row-column configuration) in the detection region AA of the substrate 21. Specifically, the photoelectric conversion elements 3 are arrayed in a first direction Dx and a second direction Dy in the detection region AA. In the present specification, the first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation viewed from the third direction Dz.

A plurality of scanning lines GL and a plurality of signal lines SL are provided corresponding to the photoelectric conversion elements 3 Specifically, the scanning lines GL each extend in the first direction Dx and are disposed side by side in the second direction Dy. One scanning line GL is electrically coupled to the photoelectric conversion elements 3 arrayed in the first direction Dx. The signal lines SL each extend in the second direction Dy and are disposed side by side in the first direction Dx. One signal line SL is electrically coupled to the photoelectric conversion elements 3 arrayed in the second direction Dy.

The light emitting elements 5 are provided in the detection region AA and are disposed side by side in the first direction Dx. The light emitting elements 5 are disposed at positions not overlapping the photoelectric conversion elements 3 in planar view. More specifically, the light emitting elements 5 are each disposed at the intersection of a gap SLx between the photoelectric conversion elements 3 disposed side by side in the first direction Dx and a gap SLy between the photoelectric conversion elements 3 disposed side by side in the second direction Dy.

In addition, the light emitting elements 5 are disposed at positions not overlapping various kinds of wiring (e.g., the scanning lines GL and the signal lines SL) provided corresponding to the photoelectric conversion elements 3. Similarly, the photoelectric conversion elements 3 are disposed at positions not overlapping various kinds of wiring (e.g., drive signal supply wiring L2) coupled to the light emitting elements 5. This configuration can suppress unintended electrical coupling between the light emitting elements 5 and the photoelectric conversion elements 3.

The light emitting element 5 is an inorganic light emitting diode (LED) chip having a size of approximately several micrometers to 300 micrometers in planar view. Typically, an element having a chip size of 100 micrometers or larger is called a mini LED, and an element having a chip size of several micrometers to smaller than 100 micrometers is called a micro LED. The present disclosure can use LEDs having any size and may choose the LEDs depending on the size of the object to be detected by the detection device 1. The term "micro" of the micro LED is not intended to limit the size of the light emitting element 5.

The light emitting elements 5 include a first light emitting element 5R, a second light emitting element 5G, and a third light emitting element 5B. The first light emitting element 5R outputs red light (emission peak wavelength of which is 580 nm to 680 nm), for example. The second light emitting element 5G outputs green light (emission peak wavelength of which is 480 nm to 560 nm), for example. The third light emitting element 5B outputs blue light (emission peak wavelength of which is 420 nm to 470 nm), for example.

In the following description, the first light emitting element 5R, the second light emitting element 5G, and the third light emitting element 5B are simply referred to as light emitting elements 5 when they need not be distinguished from one another. While one first light emitting element 5R, one second light emitting element 5G, and one third light emitting element 5B are disposed, this configuration is given by way of example only, and the present embodiment is not limited thereto. Two or more first light emitting elements 5R, second light emitting elements 5G, and third light emitting elements 5B may be provided.

The detection device 1 simply needs to include at least one or more of the first light emitting element 5R, the second light emitting element 5G, and the third light emitting element 5B. The light emitting elements 5, for example, do not necessarily include the third light emitting element 5B and may be composed of a combination of the first light emitting element 5R and the second light emitting element 5G. Alternatively, the light emitting elements 5 may be composed of one type of the light emitting elements 5 out of the first light emitting element 5R, the second light emitting element 5G, and the third light emitting element 5B. Alternatively, four or more light emitting elements 5 may be provided and output light in four or more different colors. In this case, the light emitting elements 5 may include a light emitting element 5 that outputs visible light and a light emitting element 5 that outputs infrared light.

The arrangement of the light emitting elements 5 is not limited to the configuration illustrated in FIG. 2. For example, the first light emitting element 5R, the second light emitting element 5G, and the third light emitting element 5B may be arrayed in the second direction Dy. Alternatively, the light emitting elements 5 may be arrayed in both the first direction Dx and the second direction Dy such that the first light emitting element 5R is disposed side by side with the second light emitting element 5G in the first direction Dx and that the third light emitting element 5B is disposed side by side with the second light emitting element 5G in the second direction Dy. The light emitting elements 5 are not necessarily provided in the detection region AA and may be provided in the peripheral region GA.

The sensor scanning circuit 12, the signal line selection circuit 14, the light emitting element drive circuit 16, the power supply voltage control circuit 18, and the drive IC 210 are provided in the peripheral region GA. The drive IC 210 is a circuit including at least part of the control circuit 100, the memory 102, and the detection circuit 104 illustrated in FIG. 1 and that controls detection performed by the detection device 1. The drive IC 210 is mounted in the peripheral region GA of the substrate 21 as chip on glass (COG). The mounting form is not limited thereto, and the drive IC 210 may be mounted on a wiring substrate coupled to the peripheral region GA of the substrate 21 as chip on film (COF). The wiring substrate is flexible printed circuits or a rigid substrate, for example.

The signal line selection circuit 14 couples the signal lines SL to the drive IC 210. Two sensor scanning circuits 12 are disposed in a manner sandwiching the detection region AA in the first direction Dx and are each coupled to the scanning lines GL. The light emitting element drive circuit 16 is disposed between one of the sensor scanning circuits 12 and the detection region AA. The light emitting element drive circuit 16 is electrically coupled to the gates of the drive transistors DRT of the light emitting elements 5 via the drive signal supply wiring L2. The power supply voltage control circuit 18 is provided in the peripheral region GA on the opposite side of the signal line selection circuit 14. The power supply voltage control circuit 18 is electrically coupled to the anode and the cathode of the light emitting element 5. More specifically, the power supply voltage control circuit 18 is coupled to the light emitting element 5 via anode power supply wiring L1 (anode electrode 57). The power supply voltage control circuit 18 is coupled to the light emitting element 5 via cathode power supply wiring L10 (cathode electrode 59). The cathodes of the first light emitting element 5R, the second light emitting element 5G, and the third light emitting element 5B according to the present embodiment are coupled to one common cathode power supply wiring L10 to supply them with the cathode power supply potential PVSS having the same electric potential. The cathode power supply wiring L10 may be different wires corresponding to the respective light emitting elements 5, and the anode power supply wiring L1 may be shared by the light emitting elements 5. Alternatively, both the anode power supply wiring L1 and the cathode power supply wiring L10 may be different wires corresponding to the respective light emitting elements 5. The drive IC 210 is coupled to the photoelectric conversion elements 3 via wiring 65 (reference potential supply wiring), reference potential supply wiring (not illustrated), reset control lines RG, and the like, and supplies a reference potential Vpin and a reference potential Vref, for example, to the photoelectric conversion elements 3.

The arrangement of the light emitting element drive circuit 16 and the power supply voltage control circuit 18 is not limited to the configuration illustrated in FIG. 2 and can be appropriately modified depending on the arrangement of the light emitting elements 5. The power supply voltage control circuit 18, for example, may be provided in the peripheral region GA on the same side as that of the signal line selection circuit 14. While the photoelectric conversion elements 3 in four rows and four columns, that is, a total of 16 photoelectric conversion elements 3 are disposed in FIG. 2 to simplify the explanation, this configuration is given by way of example only and can be appropriately modified. The number of photoelectric conversion elements 3 may be 15 or smaller or 17 or larger. The number of photoelectric conversion elements 3 arrayed in the first direction Dx may be different from that of photoelectric conversion elements 3 arrayed in the second direction Dy.

Figure 3:
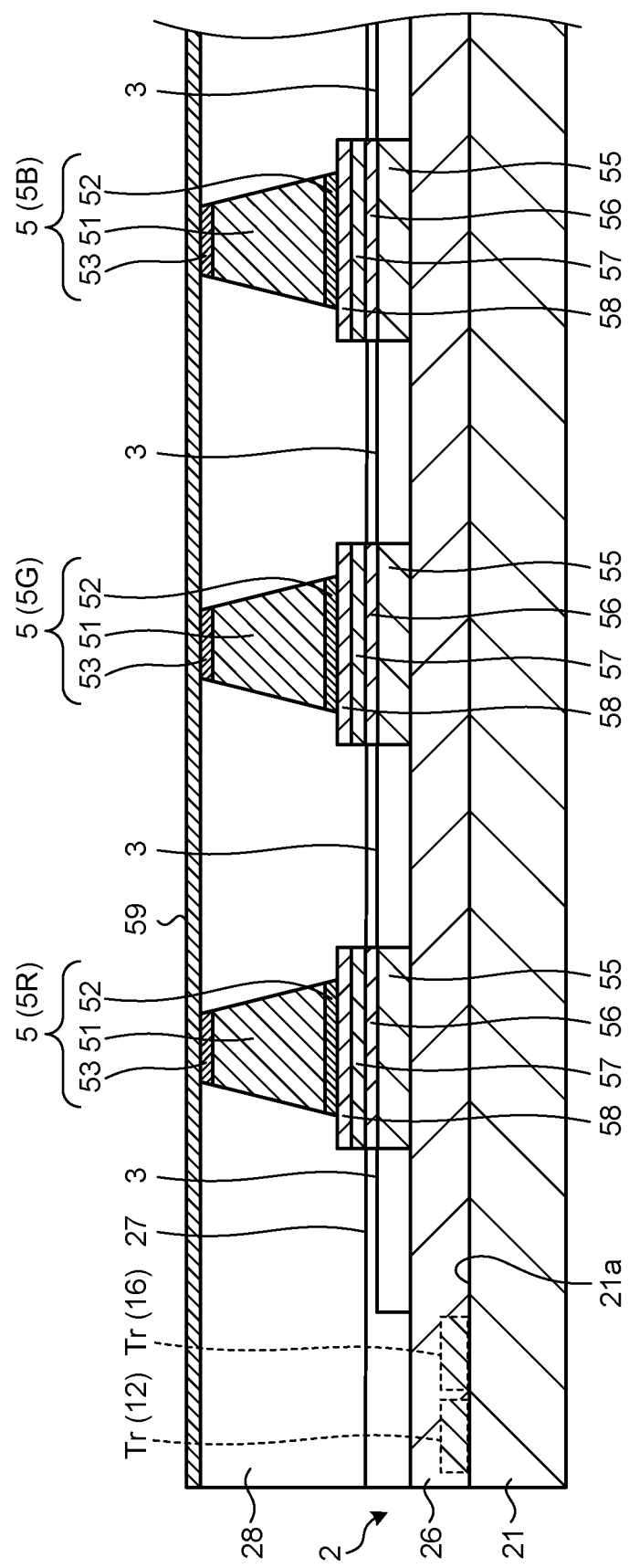
FIG. 3 is a sectional view along line of FIG. 2.

FIG. 3 is a sectional view along line of FIG. 2. In the present specification, a direction from the substrate 21 toward the light emitting element 5 in a direction perpendicular to the surface of the substrate 21 is referred to as an "upper side" or simply as "top". A direction from the light emitting element 5 to the substrate 21 is referred to as a "lower side" or simply as "bottom". To describe an aspect where a first structure is disposed on a second structure, the term "on" includes both of the following cases unless otherwise noted: a case where the first structure is disposed directly on the second structure in contact with the second structure, and a case where the first structure is disposed above the second structure with another structure interposed therebetween.

As illustrated in FIG. 3, the photoelectric conversion elements 3 and the light emitting elements 5 are provided on a first main surface 21a of the single substrate 21. The substrate 21 is an insulating substrate and is a glass substrate made of quartz or alkali-free glass or a resin substrate made of polyimide, for example. The substrate 21 is provided with a plurality of transistors Tr constituting peripheral circuits, such as the sensor scanning circuits 12 and the light emitting element drive circuit 16. The substrate 21 is provided with respective drive circuits that drive the photoelectric conversion elements 3 and the light emitting elements 5. An insulating film 26 is provided covering the transistors Tr.

The photoelectric conversion elements 3 are provided on the insulating film 26. More specifically, an i-type semiconductor layer 31 constituting the photoelectric conversion element 3 is provided on the insulating film 26.

The light emitting elements 5 are each provided on a base 55. An n-type semiconductor layer 56, an anode electrode 57, and a contact layer 58 are stacked in this order on the base 55. The contact layer 58 is made of a translucent conductive material, such as indium tin oxide (ITO).

The light emitting elements 5 each include a semiconductor layer 51, an anode terminal 52, and a cathode terminal 53. The semiconductor layer 51 can have a multi-layered structure composed of an n-type cladding layer, an active layer, and a p-type cladding layer. The semiconductor layer 51 is made of compound semiconductor, such as gallium nitride (GaN), aluminum indium gallium phosphorous (AlInGaP), aluminum gallium arsenic (AlGaAs), gallium arsenic phosphorus (GaAsP), or gallium arsenic (GaAs). The semiconductor layer 51 may be made of different materials for each of the first light emitting element 5R, the second light emitting element 5G, and the third light emitting element 5B. The active layer may have a multi-quantum well structure (MQW structure) in which well layers and barrier layers composed of several atomic layers are cyclically stacked for higher efficiency.

The anode terminal 52 is provided on the lower side (side facing the substrate 21) of the semiconductor layer 51. The cathode terminal 53 is provided on the upper side (side facing the cathode electrode 59) of the semiconductor layer 51. The light emitting element 5 is mounted on the array substrate 2 such that the anode terminal 52 is in contact with the contact layer 58. As a result, the anode terminal 52 of the light emitting element 5 is electrically coupled to the anode electrode 57 via the contact layer 58.

An insulating film 27 is provided covering the photoelectric conversion elements 3. An insulating film 28 (element insulating film) is provided between the light emitting elements 5. The insulating film 28 covers the insulating film 27 and the side surfaces of the light emitting elements 5. The insulating film 28 has openings at the positions overlapping the respective cathode terminals 53. The cathode electrode 59 is provided covering the insulating film 28 and the light emitting elements 5 and is coupled to the cathode terminals 53 of the light emitting elements 5.

The cathode electrode 59 is coupled to the power supply voltage control circuit 18 via the cathode wiring L10 provided to the substrate 21. While the light emitting elements 5 are coupled to the common cathode electrode 59, the present embodiment is not limited thereto. A plurality of cathode electrodes 59 may be provided corresponding to the respective light emitting elements 5.

As described above, the detection device 1 includes the photoelectric conversion elements 3 and the light emitting elements 5 on the single substrate 21. This configuration can downsize the detection device 1 compared with a case where the light emitting elements 5 are provided on a substrate for the light source. The light emitting elements 5 include the first light emitting element 5R, the second light emitting element 5G, and the third light emitting element 5B that output light with different wavelengths. Consequently, the light emitting elements 5 can output light with the wavelength corresponding to the type of the object to be detected.

FIG. 4 is a circuit diagram of a unit detection region of the sensor array according to the first embodiment. As illustrated in FIG. 4, a unit detection region SC includes the photoelectric conversion element 3, a reset transistor RST, a read transistor RDT, and a row selection transistor GLT. The unit detection region SC is provided with a reset control line RG and the scanning line GL serving as detection drive lines and is provided with the signal line SL serving as wiring for reading signals.

The transistors included in the unit detection region SC are composed of n-type thin-film transistors (TFTs). The present embodiment is not limited thereto, and the transistors may be composed of p-type TFTs.

The reference potential Vpin is applied to the cathode of the photoelectric conversion element 3. The anode of the photoelectric conversion element 3 is coupled to a node N. The node N is coupled to a capacitive element Ca. When the photoelectric conversion element 3 is irradiated with light, signals (electric charge) output from the photoelectric conversion element 3 are accumulated in the capacitive element Ca. The electric potential supplied to the anode is determined based on the amount of electric charge accumulated in the capacitive element Ca. When the electric potential of the node N is an electric potential Vn, the reference potential Vpin is greater than the electric potential Vn. In other words, the photoelectric conversion element 3 is controlled to be reverse-biased.

The reset transistor RST is coupled between a terminal Trs supplied with the reference potential Vref and the node N. The gate of the reset transistor RST is coupled to the reset control line RG. When the reset transistor RST is turned on (electrically continuous state) in response to a reset signal Vrst, the electric potential of the node N is reset to the reference potential Vref. The reference potential Vpin has an electric potential higher than the reference potential Vref, and the photoelectric conversion element 3 is driven in reverse bias.

The read transistor RDT is coupled between a terminal supplied with power supply VDD and the row selection transistor GLT. The gate of the read transistor RDT is coupled to the node N. The gate of the read transistor RDT is supplied with signals (electric charge) generated in the photoelectric conversion element 3. As a result, the read transistor RDT outputs a signal voltage corresponding to the signals (electric charge) generated in the photoelectric conversion element 3 to the row selection transistor GLT.

The row selection transistor GLT is coupled between the source of the read transistor RDT and the signal line SL. The gate of the row selection transistor GLT is coupled to the scanning line GL. When the row selection transistor GLT is turned on in response to the scanning signal Vread, a signal voltage corresponding to the signals output from the read transistor RDT, that is, the signals (electric charge) generated in the photoelectric conversion element 3 is output to the signal line SL.

A constant current source CS is coupled to one end of the signal line SL. The constant current source CS is coupled to the source of the read transistor RDT via the row selection transistor GLT and the signal line SL. The read transistor RDT and the constant current source CS constitute a source follower circuit. The source follower circuit enables reading signals at high speed even when the capacitance formed in the signal line SL is large.

The signals read by the read transistor RDT for the source follower are input to an amplifier 141 via the signal line SL. While FIG. 4 illustrates one unit detection region SC, a plurality of unit detection regions SC are arrayed in a matrix (row-column configuration) corresponding to the respective photoelectric conversion elements 3. In other words, the read transistor RDT is electrically coupled to each of the photoelectric conversion elements 3 and outputs signals to the detection circuit 104 via the row selection transistor GLT, the signal line SL, and the amplifier 141.

Figure 5:
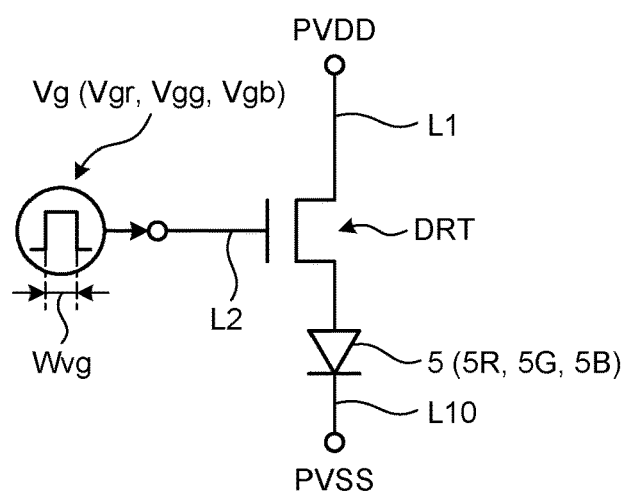
FIG. 5 is a circuit diagram of a drive circuit that drives a light emitting element according to the first embodiment.

FIG. 5 is a circuit diagram of a drive circuit that drives the light emitting element according to the first embodiment. As illustrated in FIG. 5, the drive transistor DRT is provided corresponding to each of the light emitting elements 5. In FIG. 5, one drive transistor DRT is provided corresponding to one light emitting element 5. The present embodiment is not limited thereto, and two or more transistors may be provided corresponding to one light emitting element 5.

The anode (anode terminal 52) of the light emitting element 5 is coupled to an anode power supply line L1 via the drive transistor DRT. The cathode (cathode terminal 53) of the light emitting element 5 is coupled to a cathode power supply line L10. The anode power supply line L1 and the cathode power supply line L10 are electrically coupled to the power supply voltage control circuit 18. The anode power supply line L1 is supplied with the anode power supply potential PVDD. The cathode power supply line L10 is supplied with the cathode power supply potential PVSS. The anode power supply potential PVDD is higher than the cathode power supply potential PVSS.

The gate of the drive transistor DRT is electrically coupled to the light emitting element drive circuit 16 via the drive signal supply wiring L2. When the drive transistor DRT is turned on based on the gate drive signals Vg, the light emitting element 5 is coupled to the anode power supply line L1, and an electric current corresponding to the potential difference between the anode power supply potential PVDD and the cathode power supply potential PVSS flows through the light emitting element 5. The light emitting element 5 emits light due to the flowing electric current.

The power supply voltage control circuit 18 can change the electric current flowing through the light emitting element 5 by controlling the anode power supply potential PVDD and the cathode power supply potential PVSS. The light emitting element drive circuit 16 can change the electric current flowing through the light emitting element 5 by controlling the electric potential and the pulse width Wvg of the gate drive signal Vg. The luminance and the peak wavelength of light output from the light emitting element 5 shifts depending on the flowing electric current and time (pulse width Wvg). The power supply voltage control circuit 18 may vary the anode power supply potential PVDD supplied to the first light emitting element 5R, the second light emitting element 5G, and the third light emitting element 5B. The light emitting element drive circuit 16 may vary the gate drive signal Vg (Vgr, Vgg, Vgb) supplied to the first light emitting element 5R, the second light emitting element 5G, and the third light emitting element 5B.

Figure 6:
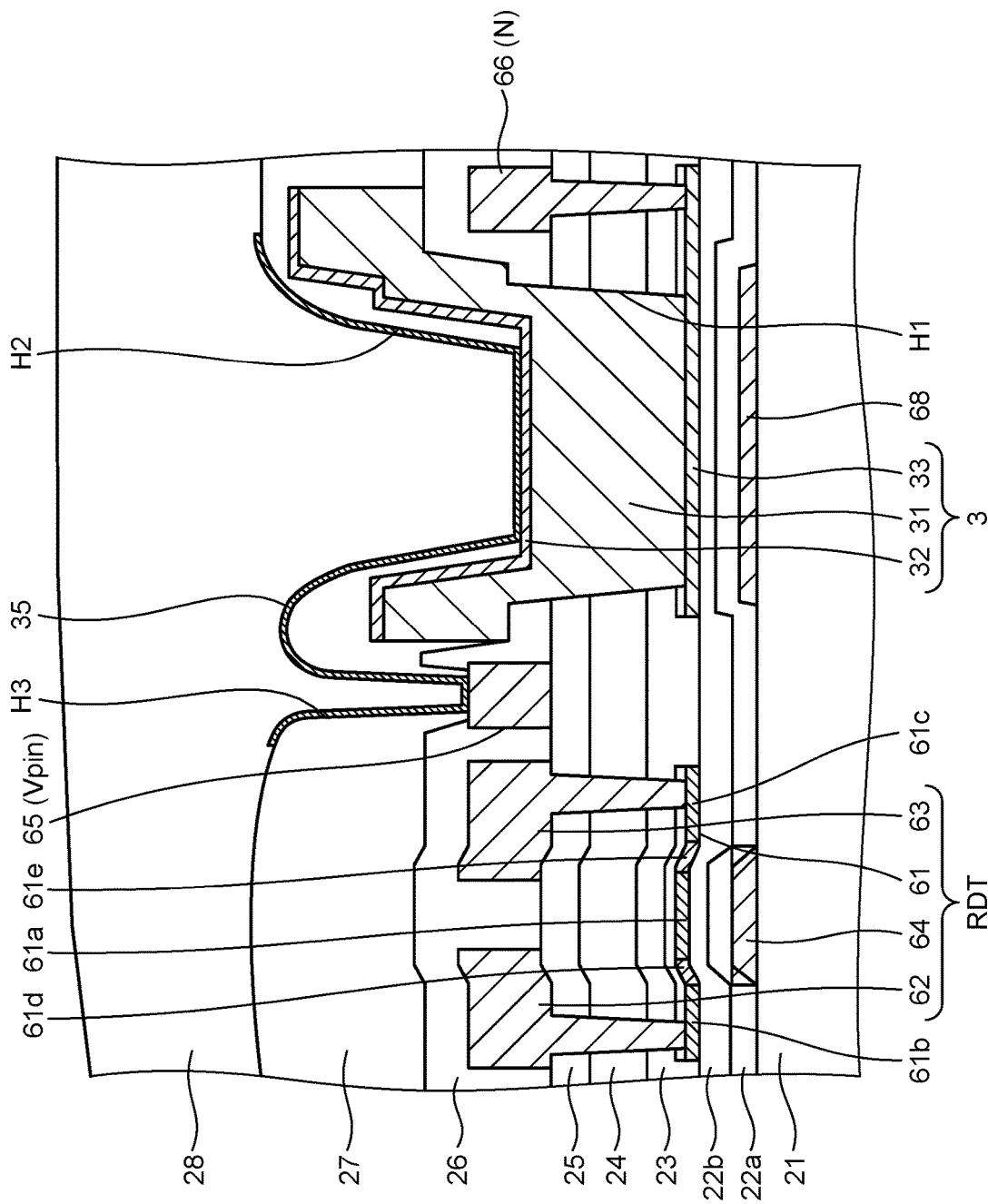
FIG. 6 is a sectional view of a photoelectric conversion element and a read transistor.

The following describes a sectional configuration of the photoelectric conversion element 3 and the light emitting element 5 in detail. FIG. 6 is a sectional view of the photoelectric conversion element and the read transistor. FIG. 6 illustrates the configuration of the read transistor RDT out of the transistors provided corresponding to the photoelectric conversion element 3. The reset transistor RST and the row selection transistor GLT can also have the same sectional configuration as that of the read transistor RDT.

As illustrated in FIG. 6, the read transistor RDT is provided on the substrate 21. The read transistor RDT includes a semiconductor layer 61, a source electrode 62, a drain electrode 63, and a gate electrode 64. The gate electrode 64 is provided on the substrate 21. Insulating films 22a and 22b are provided on the substrate 21 and covers the gate electrode 64. The insulating films 22a and 22b and insulating films 23, 24, and 25 are inorganic insulating films and are made of silicon oxide ($SiO_2$) or silicon nitride (SiN), for example.

The semiconductor layer 61 is provided on the insulating film 22b. The semiconductor layer 61 is made of polycrystalline silicon, for example. The material of the semiconductor layer 61 is not limited thereto and may be microcrystalline oxide semiconductor, amorphous oxide semiconductor, or low-temperature polycrystalline silicone (LIPS), for example. The read transistor RDT has a bottom-gate structure in which the gate electrode 64 is provided to the lower side of the semiconductor layer 61. The read transistor RDT may have a top-gate structure in which the gate electrode 64 is provided to the upper side of the semiconductor layer 61 or may have a dual-gate structure in which the gate electrode 64 is provided to the upper side and the lower side of the semiconductor layer 61.

The semiconductor layer 61 includes a channel region 61a, high-concentration impurity regions 61b and 61c, and low-concentration impurity regions 61d and 61e. The channel region 61a is an undoped intrinsic semiconductor or a low impurity region, for example, and has electric conductivity lower than that of the high-concentration impurity regions 61b and 61c and the low-concentration impurity regions 61d and 61e. The channel region 61a is provided in a region overlapping the gate electrode 64.

The high-concentration impurity regions 61b and 61c are provided in regions coupled to the source electrode 62 and the drain electrode 63, that is, regions overlapping the bottom surfaces of contact holes passing through the insulating films 23, 24, and 25. The low-concentration impurity regions 61d and 61e are provided between the channel region 61a and the high-concentration impurity regions 61b and 61c, respectively.

The insulating films 23, 24, and 25 are provided on the insulating film 22b and covers the semiconductor layer 61. The source electrode 62 and drain electrode 63 are coupled to the semiconductor layer 61 through the contact holes passing through the insulating films 23, 24, and 25. The source electrode 62 and the drain electrode 63 are multilayered films made of TiAlTi or TiAl, which is a multilayered structure of titanium and aluminum, for example.

Insulating films 26, 27, and 28 are provided on the insulating film 25 and covers the read transistor RDT. The insulating films 26, 27, and 28 are made of organic material, such as photosensitive acrylic. The insulating films 26, 27, and 28 are flattening films and can flatten the unevenness formed by the read transistor RDT and various kinds of wiring.

The photoelectric conversion element 3 includes an i-type semiconductor layer 31, an n-type semiconductor layer 32, and a p-type semiconductor layer 33. The i-type semiconductor layer 31, the n-type semiconductor layer 32, and the p-type semiconductor layer 33 are made of amorphous silicon (a-Si). The photoelectric conversion element 3 made of amorphous silicon has high sensitivity to light with different wavelengths output from the first light emitting element 5R, the second light emitting element 5G, and the third light emitting element 5B.

In the n-type semiconductor layer 32, a-Si is doped with impurities to form an n+ region. In the p-type semiconductor layer 33, polycrystalline silicon is doped with impurities to form a p+ region. The i-type semiconductor layer 31 is an undoped intrinsic semiconductor, for example, and has electric conductivity lower than that of the n-type semiconductor layer 32 and the p-type semiconductor layer 33.

The i-type semiconductor layer 31 is provided between the p-type semiconductor layer 33 and the n-type semiconductor layer 32 in the direction perpendicular to the surface of the substrate 21 (third direction Dz). In the configuration according to the present embodiment, the p-type semiconductor layer 33, the i-type semiconductor layer 31, and the n-type semiconductor layer 32 are stacked in this order.

Specifically, the p-type semiconductor layer 33 is provided in the same layer as that of the semiconductor layer 61 on the insulating film 22b. The i-type semiconductor layer 31 is provided on the insulating film 26 and is coupled to the p-type semiconductor layer 33 through a contact hole H1 passing through the insulating films 23 to 26. The n-type semiconductor layer 32 is provided on the i-type semiconductor layer 31.

Wiring 65 and 66 are provided in the same layer as that of the source electrode 62 and the drain electrode 63 on the insulating film 25. The wiring 66 is coupled to the p-type semiconductor layer 33 through a contact hole passing through the insulating films 23 to 25. The wiring 66 is coupled to the node N and is electrically coupled to the gate electrode 64 of the read transistor RDT.

The insulating film 27 is provided on the insulating film 26 and covers the photoelectric conversion element 3. The insulating film 27 has a contact hole H2 in a region overlapping the n-type semiconductor layer 32. The insulating films 26 and 27 have a contact hole H3 in a region overlapping the wiring 65. A cathode electrode 35 is provided on the insulating film 27 and is coupled to the n-type semiconductor layer 32 through the contact hole H2 and to the wiring 65 through the contact hole H3. In other words, the cathode electrode 35 electrically couples the n-type semiconductor layer 32 to the wiring 65. The cathode electrode 35 is made of, for example, a translucent conductive material such as ITO. The wiring 65 is supplied with the reference potential Vpin. The insulating film 28 is provided on the insulating film 27 and covers the cathode electrode 35.

A light-blocking film 68 is provided to the lower side of the photoelectric conversion element 3. The light-blocking film 68 is formed in the same layer as that of the gate electrode 64. The gate electrode 64 and the light-blocking film 68 are made of aluminum (Al), copper (Cu), silver (Ag), molybdenum (Mo), or an alloy film made of these metals, for example. The width of the light-blocking film 68 is wider than that of the bottom surface of the i-type semiconductor layer 31 on the side facing the substrate 21. The light-blocking film 68 can reduce light traveling from the substrate 21 and incident on the photoelectric conversion element 3.

Figure 7:
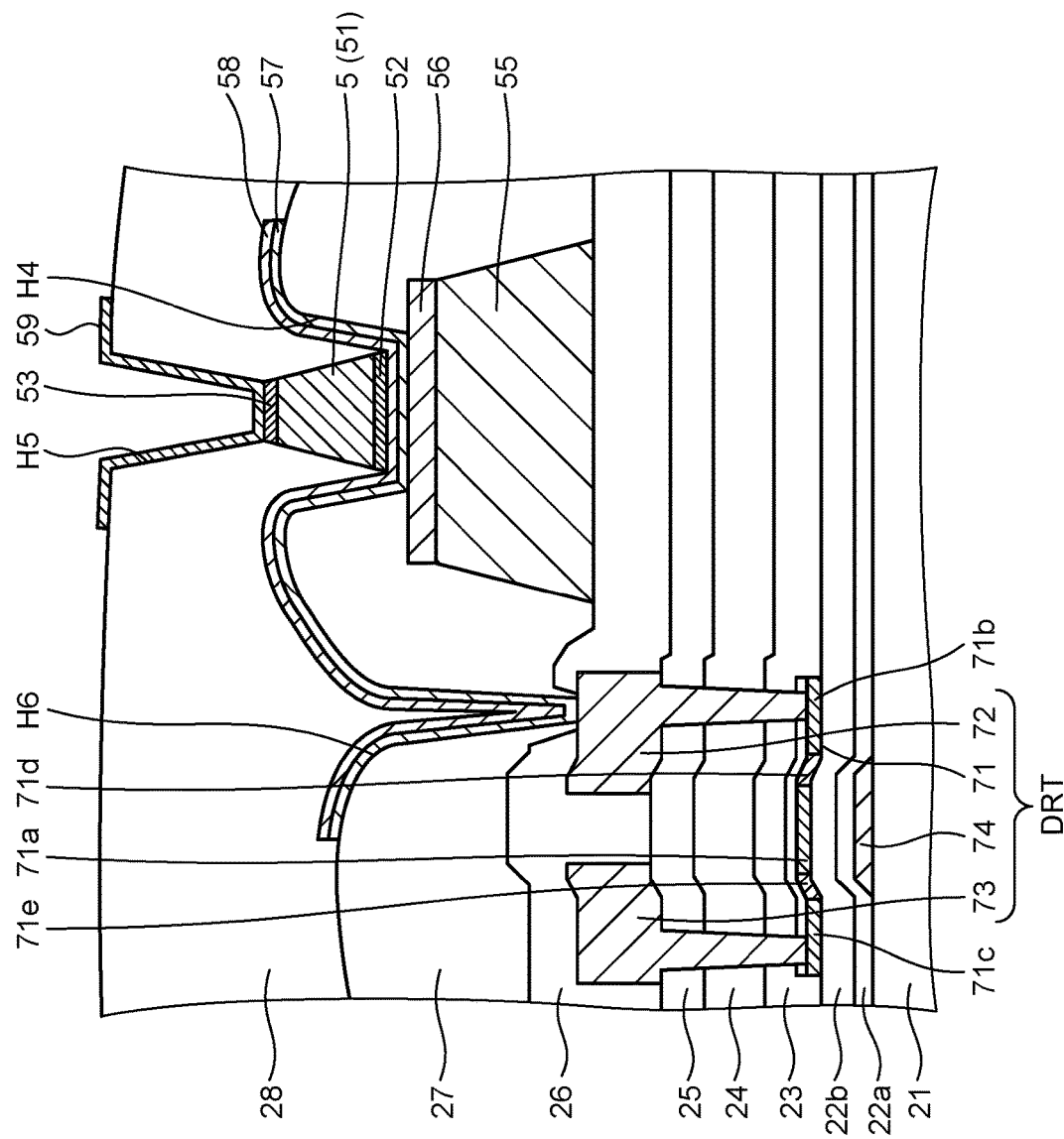
FIG. 7 is a sectional view of a light emitting element and a drive transistor.

FIG. 7 is a sectional view of the light emitting element and the drive transistor. As illustrated in FIG. 7, the drive transistor DRT includes a semiconductor layer 71, a source electrode 72, a drain electrode 73, and a gate electrode 74. The semiconductor layer 71 is made of polycrystalline silicon, and more preferably of LIPS, for example. The semiconductor layer 71 includes a channel region 71a, high-concentration impurity regions 71b and 71c, and low-concentration impurity regions 71d and 71e. The configuration of the drive transistor DRT is the same as that of the read transistor RDT, and detailed explanation thereof is omitted.

The base 55 and the n-type semiconductor layer 56 are provided on the insulating film 26. In other words, the base 55 and the n-type semiconductor layer 56 are provided in the same layer and are made of the same material as those of the i-type semiconductor layer 31 and the n-type semiconductor layer 32 of the photoelectric conversion element 3. The base 55 and the n-type semiconductor layer 56 are made of amorphous silicon, for example.

The insulating film 27 is provided on the insulating film 26 and covers the base 55 and the n-type semiconductor layer 56. The insulating film 27 has a contact holes H4 in a region overlapping the base 55 and the n-type semiconductor layer 56. The insulating films 26 and 27 have a contact hole H6 in a region overlapping the source electrode 72. The anode electrode 57 and the contact layer 58 are provided on the insulating film 27 and are coupled to the n-type semiconductor layer 56 through the contact hole H4 and to the source electrode 72 through the contact hole H6.

The anode terminal 52 of the light emitting element 5 is electrically coupled to the anode electrode 57 via the contact layer 58 at the bottom of the contact hole H4. The anode terminal 52 of the light emitting element 5 is electrically coupled to the source electrode 72 of the drive transistor DRT via the anode electrode 57 and the contact layer 58.

The insulating film 28 is provided on the insulating film 27 and covers the light emitting element 5. The insulating film 28 has a contact hole H5 in a region overlapping the cathode terminal 53. The cathode electrode 59 is coupled to the cathode terminal 53 through the contact hole H5.

The light emitting element 5 according to the present embodiment is provided on the base 55. This configuration facilitates adjustment of the height position of the light emitting element 5 even when the photoelectric conversion element 3 and the light emitting element 5 are provided on the single substrate 21. Specifically, this configuration enables making the height position of the light emitting element 5 closer to the object to be detected (farther away from the substrate 21) than the photoelectric conversion element 3 Consequently, the present embodiment can efficiently output light emitted from the light emitting element 5 to the object to be detected.

As a result, the present embodiment can reduce light directly incident on the photoelectric conversion element 3 and stray light traveling in the array substrate 2 in the light output from the light emitting element 5. In addition, the base 55 can absorb stray light traveling in the array substrate 2 because the base 55 is made of amorphous silicon. This configuration can prevent the photoelectric conversion element 3 from detecting stray light. Consequently, the detection device 1 can improve the detection accuracy.

The part between the substrate 21 and the base 55 to the lower side of the light emitting element 5 and the base 55 is provided with the insulating films 22a to 26 and is not provided with the wiring coupled to the various transistors or the wiring coupled to the photoelectric conversion element 3. This configuration can prevent the drive circuit of the light emitting element 5 and the drive circuit of the photoelectric conversion element 3 from applying an unintended electric potential to the light emitting element 5. Consequently, the present embodiment can suppress fluctuations in the electric current flowing through the light emitting element 5.

Figure 8:
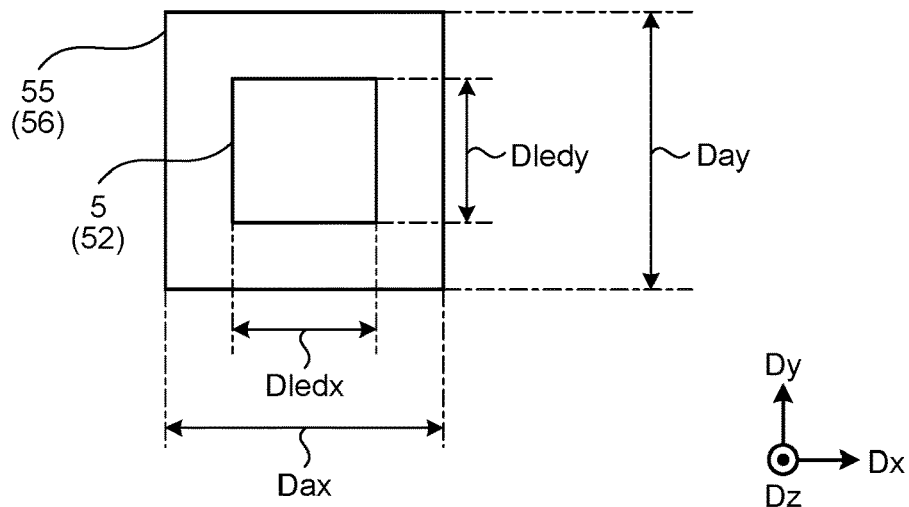
FIG. 8 is a plan view schematically illustrating the configuration of the light emitting element and a base.

FIG. 8 is a plan view schematically illustrating the configuration of the light emitting element and the base. As illustrated in FIG. 8, the area of the base 55 is larger than that of the light emitting element 5 in planar view. The area of the base 55 corresponds to the area of the upper surface of the base 55. In other words, the area of the base 55 is equal to that of the n-type semiconductor layer 56. The area of the light emitting element 5 corresponds to the area of the surface (lower surface) of the light emitting element 5 coupled to the contact layer 58. In this case, the area of the light emitting element 5 is equal to that of the anode terminal 52.

More specifically, a length Dledx of the light emitting element 5 in the first direction Dx is shorter than a length Dax of the base 55 in the first direction Dx. A length Dledy of the light emitting element 5 in the second direction Dy is shorter than a length Day of the base 55 in the second direction Dy.

With this configuration, the base 55 can satisfactorily absorb stray light. The anode electrode 57 can reflect light traveling toward the substrate 21 in the light output from the light emitting element 5 because it is provided covering the base 55. Consequently, the present embodiment can increase the light extraction efficiency of the light emitting element 5.

The base 55 is not necessarily made of the same amorphous silicon as that of the i-type semiconductor layer 31. The base 55 may be a multilayered body of amorphous silicon and microcrystalline silicon. In this case, the base 55 can absorb stray light in a wider wavelength range.

Figure 9:
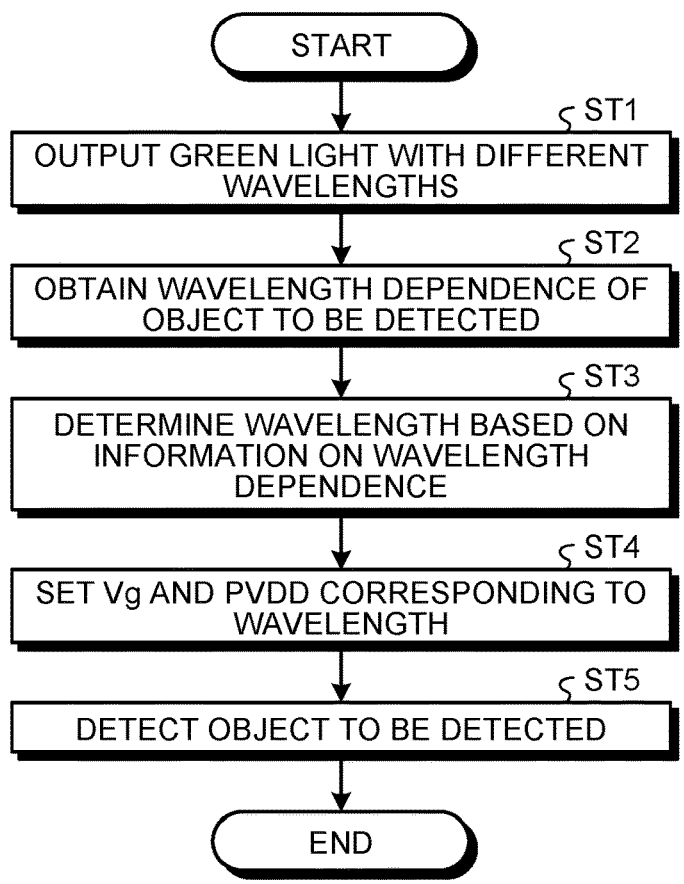
FIG. 9 is a flowchart for explaining a detection method performed by the detection device according to the first embodiment.

The following describes an example of the detection method performed by the detection device 1 with reference to FIG. 1 and FIGS. 9 to 11. FIG. 9 is a flowchart for explaining the detection method performed by the detection device according to the first embodiment. FIG. 9 illustrates an example of detecting the object to be detected based on green light by turning on the second light emitting element 5G out of the first light emitting element 5R, the second light emitting element 5G, and the third light emitting element 5B. In this case, the detection device 1 can detect fingerprints, vascular images (vein patterns) of fingers and palms, pulse waves, and pulse rate, for example, as biometric information on the object to be detected.

The detection device 1 stores in advance the characteristics of the photoelectric conversion element 3 and the light emitting element 5 in the memory 102 (Step ST0). Examples of the information stored in the memory 102 include, but are not limited to, spectral sensitivity characteristics of the photoelectric conversion element 3, information indicating the relation between the current density and the peak wavelength of the light emitting element 5 (refer to FIG. 11), information indicating the relation between the electric current and the luminance of the light emitting element 5, etc. The memory 102 stores these pieces of information as a look-up table (LUT).

Subsequently, the control circuit 100 supplies control signals to the light emitting element drive circuit 16 and the power supply voltage control circuit 18 to drive the second light emitting element 5G. The second light emitting element 5G outputs green light with different wavelengths based on the control signals from the control circuit 100 (Step ST1). The photoelectric conversion element 3 detects information on the object to be detected based on each green light with different wavelengths, thereby obtaining wavelength dependence of the object to be detected (Step ST2).

Figure 10:
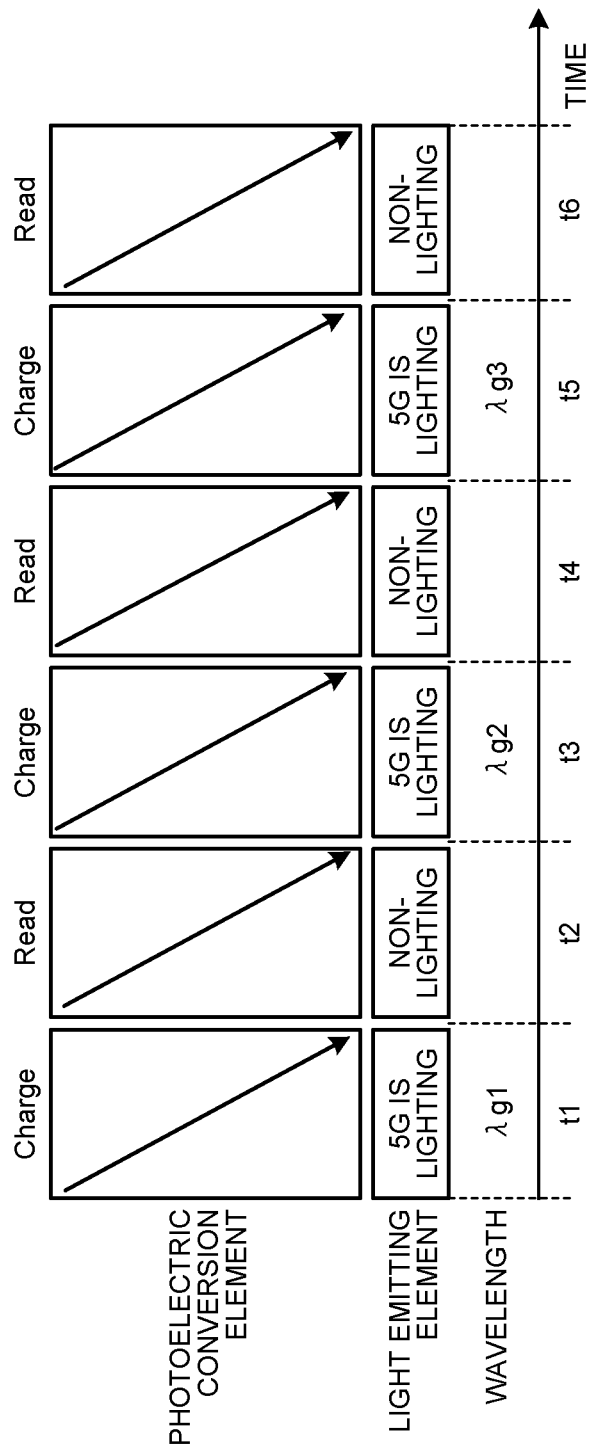
FIG. 10 is a diagram for explaining the relation between drive of the photoelectric conversion element and a lighting operation of the light emitting element.
Figure 11:
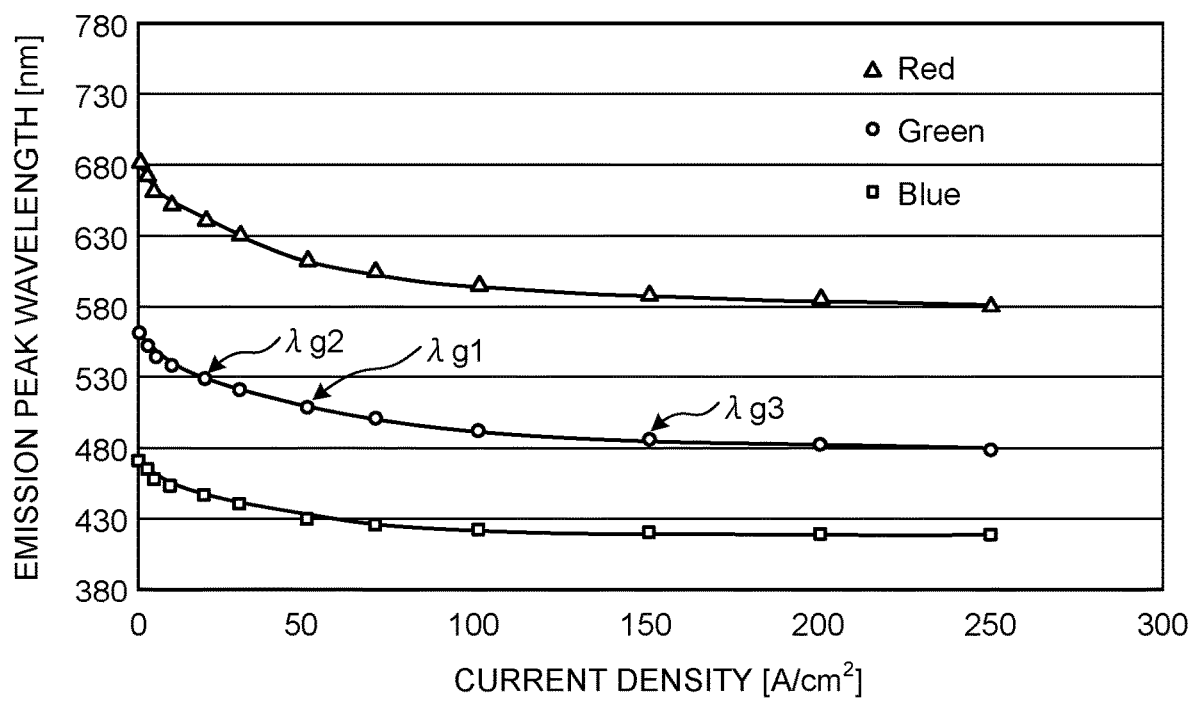
FIG. 11 is a graph of an example of the relation between current density of an electric current flowing through the light emitting element and emission peak wavelength.

The following describes a specific example of Steps ST1 and ST2 with reference to FIGS. 10 and 11. FIG. 10 is a diagram for explaining the relation between drive of the photoelectric conversion element and a lighting operation of the light emitting element. FIG. 11 is a graph of an example of the relation between current density of an electric current flowing through the light emitting element and emission peak wavelength. The horizontal axis of the graph illustrated in FIG. 11 is the current density of the light emitting element 5, and the vertical axis is the wavelength indicating the maximum emission intensity in the spectrum of light output from the light emitting element 5.

As illustrated in FIG. 10, the second light emitting element 5G is turned on in a period t1 and outputs light with a wavelength $\lambda g1$. As illustrated in FIG. 11, the wavelength $\lambda g1$ is an emission peak wavelength of approximately 506 nm, for example. As described above, the light emitting elements 5 are LEDs (micro LEDs) including a gallium nitride semiconductor layer, and the wavelengths of light output from the light emitting elements 5 vary depending on the current density of electric currents flowing through the respective light emitting elements 5. As the current density of the electric current flowing through the light emitting element 5 increases, the wavelength λ tends to become shorter. The amount of change in the wavelength λ increases in the order of the third light emitting element 5B, the second light emitting element 5G, and the first light emitting element 5R. The electric current flowing through the light emitting element 5 is determined based on the potential difference between the anode terminal 52 and the cathode terminal 53 of the light emitting element 5. The control circuit 100 can control the current density of the electric current flowing through the light emitting element 5 by varying the anode power supply potential PVDD supplied from the power supply voltage control circuit 18, for example.

As illustrated in FIG. 10, the photoelectric conversion element 3 receives light with the wavelength λg1 reflected by the object to be detected and outputs signals (electric charge) corresponding to the light with the wavelength λg1 in a charge period (Charge). The charge period is a period overlapping the period t1. Subsequently, the second light emitting element 5G is turned off in a period t2. The photoelectric conversion element 3 outputs the accumulated signals (electric charge) to the read transistor RDT in a read period (Read). As a result, the detection device 1 detects the detection signals Vdet corresponding to the light with the wavelength λg1.

Subsequently, the second light emitting element 5G is turned on in a period t3 and outputs light with a wavelength λg2. The wavelength λg2 is an emission peak wavelength of approximately 528 nm, for example. The photoelectric conversion element 3 outputs signals (electric charge) corresponding to the light with the wavelength λg2 in the charge period (Charge). The second light emitting element 5G is turned off in a period t4. The photoelectric conversion element 3 outputs the accumulated signals (electric charge) to the read transistor RDT in the read period (Read). As a result, the detection device 1 detects the detection signals Vdet corresponding to the light with the wavelength λg2.

The second light emitting element 5G is turned on in a period t5 and outputs light with a wavelength λg3. The wavelength λg3 is an emission peak wavelength of approximately 487 nm, for example. The photoelectric conversion element 3 outputs signals (electric charge) corresponding to the light with the wavelength λg3 in the charge period (Charge). The second light emitting element 5G is turned off in a period t6. The photoelectric conversion element 3 outputs the accumulated signals (electric charge) to the read transistor RDT in the read period (Read). As a result, the detection device 1 detects the detection signals Vdet corresponding to the light with the wavelength λg3.

As described above, the detection device 1 can obtain the wavelength dependence of light received from the object to be detected based on the light with different wavelengths λg1, λg2, and λg3 output from the light emitting element 5. The wavelength dependence is information, such as the amplitude (absolute value of the electric potential) and the SN ratio of the detection signals Vdet corresponding to the respective wavelengths λg1, λg2, and λg3, for example. In FIG. 10, the photoelectric conversion element 3 may have a reset period for being supplied with the reference potential Vref when the second light emitting element 5G changes the wavelength λg.

Referring back to FIG. 9, the control circuit 100 determines a selected wavelength λg of light suitable for detecting the object to be detected based on the information on the wavelength dependence of the object to be detected (Step ST3).

The control circuit 100 sets the gate drive signals Vg and the anode power supply potential PVDD, for example, such that an electric current corresponding to the selected wavelength λg flows through the light emitting element 5 (Step ST4). The control circuit 100 calculates the potential difference to be supplied to the light emitting element 5 such that an electric current corresponding to the selected wavelength λg flows based on the information received from the memory 102. The control circuit 100 sets the anode power supply potential PVDD based on the potential difference to be supplied to the light emitting element 5. The control circuit 100 acquires the relation between the selected wavelength λg of incident light and quantum efficiency from the memory 102 based on the spectral sensitivity characteristics of the photoelectric conversion element 3. If the quantum efficiency at the selected wavelength λg is lower than a reference quantum efficiency, for example, the control circuit 100 makes the pulse width Wvg of the gate drive signal Vg larger.

The control circuit 100 drives the second light emitting element 5G and the photoelectric conversion element 3 under the various set conditions to detect the object to be detected at the selected wavelength λg (Step ST5).

As described above, the detection device 1 appropriately changes the wavelength of light output from the light emitting elements 5 depending on the type, the state, and other factors of the object to be detected. As a result, the detection device 1 can improve the detection performance compared with a configuration that performs detection at fixed wavelengths for the respective light emitting elements 5. In addition, the detection device 1 requires a smaller number of second light emitting elements 5G than in a case where a plurality of second light emitting elements 5G are provided for the respective different wavelengths in the wavelength range of green light (emission peak wavelength of which is 480 nm to 560 nm), for example.

The present embodiment is not limited to the example illustrated in FIG. 10, and the detection device 1 may turn on the first light emitting element 5R and detect the object to be detected based on red light. In this case, the detection device 1 can detect the blood oxygen level, for example, as the biometric information on the object to be detected. The detection device 1 can detect the blood oxygen level, for example, by using the difference in reflection and absorption by the object to be detected between light with a short wavelength and light with a long wavelength in the light output from the first light emitting element 5R.

Alternatively, the detection device 1 may turn on the third light emitting element 5B and detect the object to be detected based on blue light. In this case, the detection device 1 can detect the amount of sebum, for example, as the biometric information on the object to be detected.

While FIG. 10 illustrates an example where the light emitting element 5 outputs light with three different wavelengths λg1, λg2, and λg3, for example, the present embodiment is not limited thereto. The light emitting element 5 may output light with four or more different wavelengths. While the charge period (Charge) of the photoelectric conversion element 3 overlaps the lighting period of the light emitting element 5, and the read period (Read) overlaps the non-lighting period in FIG. 10, the present embodiment is not limited thereto. The charge period (Charge) may partially overlap the non-lighting period, and the read period (Read) may partially overlap the lighting period.

The parts described as the anode terminal 52 and the cathode terminal 53 in the explanation above are not limited to those described in the specification depending on the coupling direction of the light emitting element 5 and the direction of voltage application. The anode terminal 52 and the cathode terminal 53 may be switched.

While one electrode of the light emitting element 5 is disposed on the lower side, and the other electrode is disposed on the upper side in FIGS. 3 and 7, both of them may be disposed on the lower side, that is, the side facing the array substrate 2. In other words, the detection device 1 does not necessarily have a face-up structure in which the upper part of the light emitting element 5 is coupled to the cathode electrode 59. The detection device 1 may have what is called a face-down structure in which the lower part of the light emitting element 5 is coupled to the anode electrode 57 and the cathode electrode 59. The present embodiment describes a case where the sensor scanning circuits 12 are disposed at both ends of the sensor array 10 in the first direction Dx, the present embodiment is not limited thereto. The sensor scanning circuit 12 may be disposed at only one end of the sensor array 10 in the first direction Dx.

A cover glass or the like may be stacked on the surface of the detection device 1 as necessary. The detection device 1 may be integrated with a display device. The detection device 1 may be provided overlapping part of the display surface or provided in the housing of the display device.

Modifications

Figure 12:
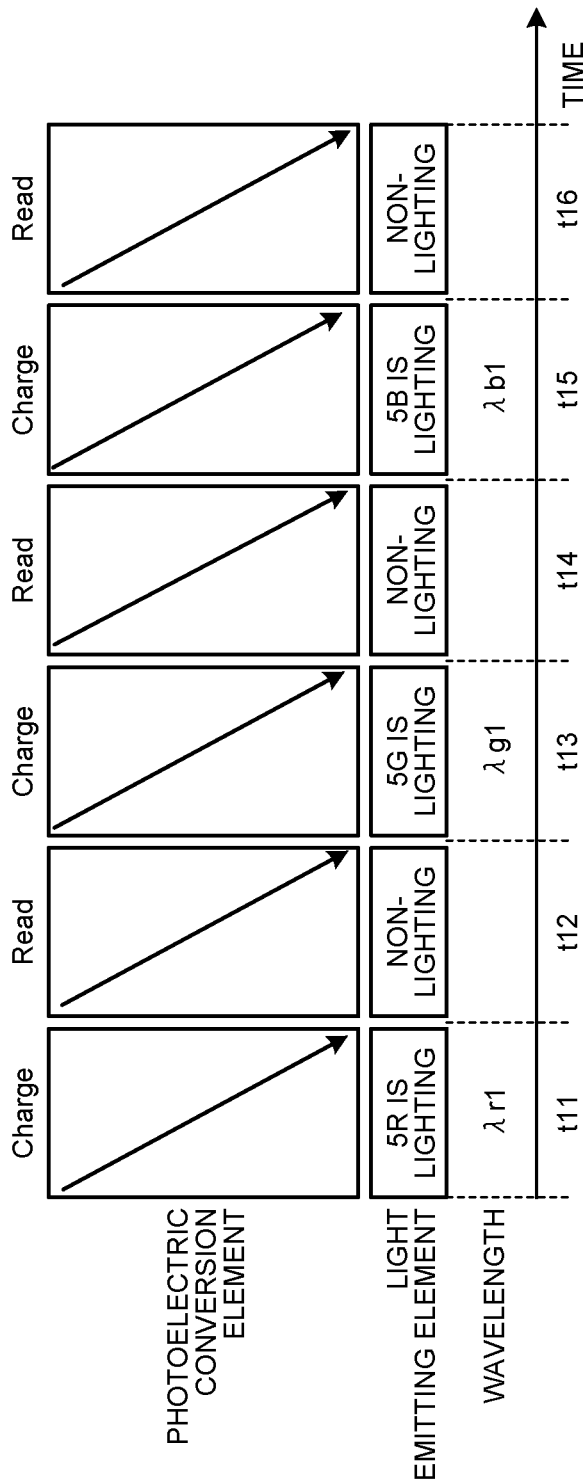
FIG. 12 is a diagram for explaining the relation between drive of the photoelectric conversion element and the lighting operation of the light emitting element of the detection device according to a modification.

FIG. 12 is a diagram for explaining the relation between drive of the photoelectric conversion element and the lighting operation of the light emitting element of the detection device according to a modification. As illustrated in FIG. 12, the first light emitting element 5R, the second light emitting element 5G, and the third light emitting element 5B output light in a time-division manner in the detection device 1 according to the modification. Specifically, the first light emitting element 5R outputs light with a wavelength λr1 in a period t11. The photoelectric conversion element 3 detects the object to be detected based on the light with the wavelength λr1 in the periods t11 and t12.

Subsequently, the second light emitting element 5G outputs light with a wavelength λg1 in a period t13. The photoelectric conversion element 3 detects the object to be detected based on the light with the wavelength λg1 in the periods t13 and t14. The third light emitting element 5B outputs light with a wavelength λb1 in a period t15. The photoelectric conversion element 3 detects the object to be detected based on the light with the wavelength λb1 in the periods t15 and t16.

The detection device 1 according to the modification can detect a plurality of different types of biometric information on one object to be detected based on the light with different wavelengths λr1, λg1, and λb1. In this case, the detection device 1 preferably sets the wavelength suitable for the object to be detected by the method illustrated in FIGS. 9 and 10 for at least one of the wavelengths λr1, λg1, and λb1.

Second Embodiment

Figure 13:
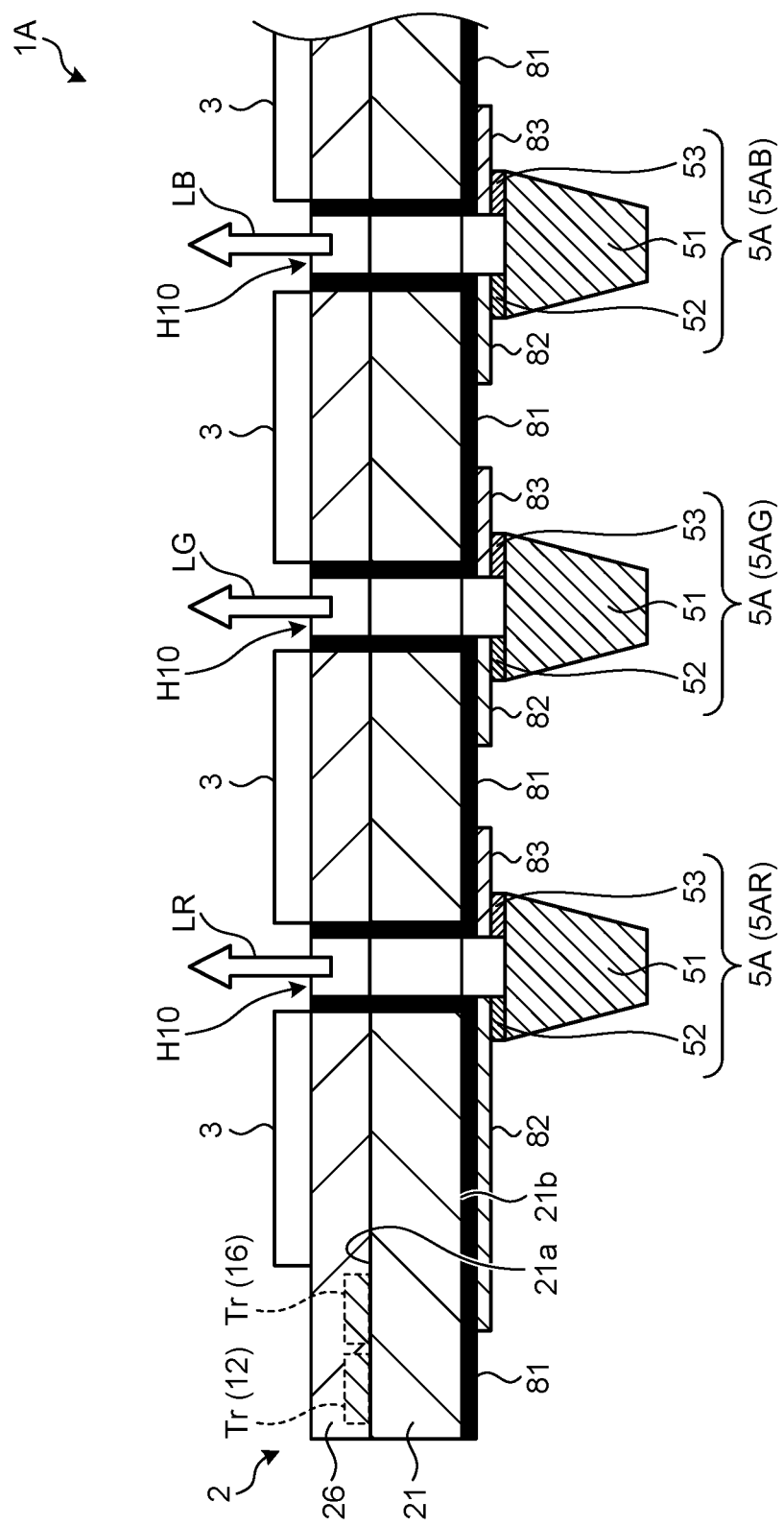
FIG. 13 is a sectional view schematically illustrating the detection device according to a second embodiment.

FIG. 13 is a sectional view schematically illustrating the detection device according to a second embodiment. In the following description, the same components as those described in the embodiment above are denoted by like reference numerals, and overlapping explanation thereof is omitted.

As illustrated in FIG. 13, a plurality of photoelectric conversion elements 3 in a detection device 1A according to the second embodiment are provided to the upper side of a first main surface 21a of the substrate 21, and light-emitting elements 5A are provided to the lower side of a second main surface 21b opposite to the first main surface 21a. The light emitting element 5A has what is called a face-down structure. In other words, the anode terminal 52 and a cathode terminal 53A are provided on the surface facing the substrate 21 (the upper surface of the semiconductor layer 51 in FIG. 13) of the light emitting element 5A. The anode terminal 52 and the cathode terminal 53A are coupled to an anode electrode 82 and a cathode electrode 83, respectively, provided on the second main surface 21b.

The substrate 21 has through holes H10 in regions overlapping the respective light emitting elements 5A and not overlapping the photoelectric conversion elements 3. In other words, at least part of the light emitting element 5A is provided in a region not overlapping the photoelectric conversion elements 3. The through hole H10 passes from the first main surface 21a to the second main surface 21b. The through hole H10 passes through a plurality of insulating films including the insulating film 26. The anode terminal 52 and the cathode terminal 53A are disposed apart from each other at positions not overlapping the through hole H10 on the upper surface of one light emitting element 5A.

A black member 81 is provided on the second main surface 21b of the substrate 21 and the inner walls of the through holes H10. The black member 81 covers the entire circumference of the inner wall of each through hole H10 and is continuously provided from the first main surface 21a to the second main surface 21b. The black member 81 covers the entire region of the second main surface 21b except for the regions having the through holes H10. The black member 81 is not necessarily provided in the regions overlapping the anode electrode 82 and the cathode electrode 83. The black member 81 is a low-reflective film made of material having light absorbance higher than that of the anode electrode 82, for example. The black member 81 is made of black-colored resin material, carbon, or metal or metal oxide that exhibits black color due to thin-film interference.

Lights LR, LG, and LB output from a first light emitting element 5AR, a second light emitting element 5AG, and a third light emitting element 5AB, respectively, travel from the upper surface of the respective light emitting elements 5A toward the first main surface 21a through the through holes H10. The photoelectric conversion elements 3 detect light reflected by the object to be detected in proximity to the first main surface 21a out of the lights LR, LG, and LB.

With the black member 81, the present embodiment can prevent the lights LR, LG, and LB output from the light emitting elements 5A from passing through the substrate 21 and being directly incident on the photoelectric conversion elements 3. In addition, the present embodiment can prevent the lights LR, LG, and LB from traveling from the inner walls of the respective through holes H10 to the inside of the substrate 21 and being incident on the photoelectric conversion elements 3 as stray light. Consequently, the detection device 1A can improve the detection performance if the photoelectric conversion elements 3 are provided on the first main surface 21a of the substrate 21, and the light emitting elements 5A are provided on the second main surface 21b of the substrate 21.

The detection device 1A may appropriately include an insulating film, a protective film, a cover glass, or the like covering the photoelectric conversion elements 3. The detection device 1A may also include an insulating film that provides insulation between the light emitting elements 5A, a protective film that protects the light emitting elements 5A, or other films as necessary.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments above and the modifications thereof.

What is claimed is:

1. A photo detecting device comprising:
    a substrate;
    a plurality of photoelectric conversion elements provided to the substrate and configured to output a detection signal corresponding to light with which the photoelectric conversion elements are irradiated;
    at least one or more light emitting elements provided to the substrate; and
    a control circuit configured to set a wavelength of light output from the light emitting element by controlling an electric current flowing through the light emitting element, wherein
    the photoelectric conversion elements are provided to an upper side of a first main surface of the substrate,
    the light emitting element is provided to a lower side of a second main surface opposite to the first main surface, and
    a through hole passing through the first main surface and the second main surface of the substrate is formed in a region overlapping the light emitting element and not overlapping the photoelectric conversion elements.

2. The photo detecting device according to claim 1, wherein the control circuit is configured to obtain wavelength dependence of light from an object to be detected based on light with different wavelengths output from the light emitting element.

3. The photo detecting device according to claim 2, further comprising:
    a memory configured to store therein information on the photoelectric conversion elements and information on the light emitting element, wherein
    the control circuit is configured to set the wavelength of the light output from the light emitting element based on information on the wavelength dependence, and
    the control circuit is configured to set a signal supplied to the light emitting element based on the information on the photoelectric conversion elements and the information on the light emitting element stored in the memory.

4. The photo detecting device according to claim 1, further comprising:
    a power supply voltage control circuit configured to supply a power supply potential to an anode of the light emitting element based on a control signal from the control circuit;
    a drive transistor provided corresponding to the light emitting element; and
    a light emitting element drive circuit configured to supply a drive signal to the drive transistor based on a control signal from the control circuit.

5. The photo detecting device according to claim 1, wherein the light emitting element is an LED including a gallium nitride semiconductor layer.

* * * * *